United States Patent
Kash et al.

(10) Patent No.: US 6,774,647 B2
(45) Date of Patent: Aug. 10, 2004

(54) NONINVASIVE OPTICAL METHOD AND SYSTEM FOR INSPECTING OR TESTING CMOS CIRCUITS

(75) Inventors: Jeffrey Alan Kash, Pleasantville, NY (US); Daniel R. Knebel, Mahopac, NY (US); James Chen-Hsiang Tsang, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 178 days.

(21) Appl. No.: 10/072,486

(22) Filed: Feb. 7, 2002

(65) Prior Publication Data

US 2003/0146768 A1 Aug. 7, 2003

(51) Int. Cl.[7] .................. H01H 31/02; G01R 31/302; G06F 19/00
(52) U.S. Cl. .................. 324/752; 324/537; 702/84; 700/110
(58) Field of Search .................. 324/537, 73.1, 324/158.1, 750–754; 702/84; 714/38; 356/72; 700/108–110

(56) References Cited

U.S. PATENT DOCUMENTS

| | | | | |
|---|---|---|---|---|
| 4,680,635 A | * | 7/1987 | Khurana .................. | 348/79 |
| 5,175,495 A | * | 12/1992 | Brahme et al. .................. | 714/738 |
| 5,301,006 A | * | 4/1994 | Bruce .................. | 356/311 |
| 5,940,545 A | * | 8/1999 | Kash et al. .................. | 382/312 |

FOREIGN PATENT DOCUMENTS

EP        0 639 778 A2  *  8/1993  ......... G01R/31/308

\* cited by examiner

Primary Examiner—Evan Pert
Assistant Examiner—Paresh Patel
(74) Attorney, Agent, or Firm—Scully, Scott, Murphy & Presser; Richard M. Ludwin

(57) ABSTRACT

A method and system for testing an integrated circuit. The method comprises the steps of obtaining periodic optical emissions over a defined period of time and from a defined area of an integrated circuit operating with time-varying internal currents, and time resolving said emissions by photon timing to estimate the number of switching events occurring in said defined area over said defined period. The method further comprises the steps of providing an optical emission model, and comparing the optical emissions from the area of the integrated circuit with the optical emission model to determine whether any of a group of defined conditions are present on the integrated circuit. For example, this test may be used to detect local power supply loading under high power density operation, or to derive changes in mobility due to heating effects.

20 Claims, 2 Drawing Sheets

NONINVASIVE OPTICAL METHOD AND SYSTEM FOR INSPECTING OR TESTING CMOS CIRCUITS

BACKGROUND OF THE INVENTION

1. Field of the Invention

This invention generally relates to methods and systems for inspecting or testing CMOS circuits. More specifically, the invention relates to measuring the density of local switching activity in CMOS integrated circuits and perturbations of the electrical behavior of devices in such circuits due to the presence of temporally coincident local switching activity.

2. Prior Art

Modern integrated circuits may have an extremely large number and extremely high density of gates. The large number and high density of gates causes problems that can be very difficult to diagnose or assess. For example, assume we have a planar integrated circuit which has M of its gates within some area X. Each of these gates when it switches, draws S coulombs. The power lines supplying Vdd to this area can provide a maximum of A amps during a short time interval of Y. If during the course of running a set of instructions, N of the M gates switch over a time interval of Y, then the total charge required to support this activity is NS. If the required charge NS is greater than the local charge AY that can be supplied to the area X over the time Y, then the local voltage will be reduced. The magnitude of the decrease will depend on the details of the power bus system. Such decreases in local power supply voltage can produce errors in the operation of an integrated circuit (IC) since thresholds can be missed, and switching times slowed.

Such a failure cannot be detected by looking just at individual devices since the failure arises from the interaction of many normally functioning devices. An ideal solution would be able to detect the presence of simultaneous electrical activity in areas of the chip on the time scale of the time constant of the power supply system. That solution would then be able to deduce changes in the local supply voltage during this activity.

High densities of circuit operation in small areas and over short periods of time can also produce local heating effects, which introduce errors into the operation of the circuit. High densities of switching activity also increase the possibility of cross talk and errors associated with this. This can trigger false switching activity, which even when it does not produce errors in the operation of the chip, should be avoided, and a technique that allows the identification of cross-talk effects will be valuable.

Given that ICs meant for mobile applications generally have stringent limits on their power dissipation, if an IC consumes more power than its design predicts, it is important to know where and when power is being dissipated in a chip, even when there is no heating or loading of the power supply generating errors in computation.

It is also important to be able to identify particular instructions that consume anomalous amounts of power in a chip, and to determine both where in a chip such anomalous powers are being dissipated, and when during the execution of the instruction set by a chip this is occurring, especially if design criteria are being exceeded. Finally, leakage effects are becoming major contributors to power consumption in modern chips. Various circuit techniques, such as multiple threshold CMOS, are used to control the leakage in ICs and a tool to verify the effectiveness of such techniques would be valuable.

CMOS technology is nominally a low power technology since in the absence of switching activity, there is little or no power dissipation. However, switching activity generates power losses in a chip. The power dissipation attributable to a change of output state per gate under normal circumstances is proportional to the frequency of switching, the load on the gate, and the square of the bias voltage, Vdd. As the density of gates and operating frequencies increase in ICs, total power dissipation per unit area increases also, even though by the scaling relationships which are the starting point for decreasing device sizes, there are also decreases in the individual gate loads and bias voltages. The automatic process by which device layouts are produced on chips can result in situations where the density of switching activity in a limited region of the chip and over a short period of time in the operation of the chip may exceed basic limits of power delivery and extraction for the design.

Modern CMOS integrated circuits can contain over 50,000,000 active devices/cm$^2$. Present and future microprocessors dissipate power at the tens to hundreds of watts level. Such high levels of power and power density can cause significant problems in operation, reliability etc. This is especially so if the power dissipation is localized in small regions of a chip and for short intervals of time during the execution of instruction sets. Current device densities are high enough, and the power dissipation per device during electrical switching is large enough, that switching activity by many devices in a small area can decrease the power supply voltage in that area or raise the local temperature.

These perturbations are usually time dependent effects, depending on the device layout, and the time dependence of the switching by the neighboring gates. Such local loading of the power supply or heating can produce errors in the operation of devices in this local area at particular periods of time. Errors which occur only due to particular instructions or sets of instructions, and only during particular instances of time in executing a group of instructions, can be difficult to identify by traditional techniques and methods.

A method for the determination of the behavior of any given device in a chip, in the presence of electrical activity by neighboring gates and devices, is needed now. The complexity of the design process, the use of automated methods of circuit placement, and the size of modern programs must leave the identification of such "hot spots" to the qualification process for the chip. The effects of these "hot spots" can be removed through changes in chip layouts, decoupling of the power supply lines etc., which are applied when such a problem can be identified.

Present techniques for solving these problems include modeling and simulations of chips. Unfortunately, the complexity of the chips, and the instruction sets is such that capabilities are far short of needs at present. The computational times required for detailed simulations prevent large scale applications of such techniques. The modeling and simulations are too long and also rely on assumptions about the fabrication and physical properties of the chip which may not correspond to real chips.

Physical methods for identifying such problems include gross measurements of IC supply currents on the assumption that high currents are associated with high levels of switching activity. Aside from problems associated with leakage currents complicating the analysis, such approaches produce no local information in the absence of additional test circuitry on the chip. On-chip control circuits can be used to isolate or limit circuit switching so that currents associated with specific circuits, or test patterns, can be identified. This extra circuitry adds complexity to the chip, and also extra cost. High impedance probes can either be built into the chip, or placed with tools such as focused ion beam milling to measure local circuit activity. Diodes can be built into circuits to measure local temperatures. All of these techniques add complexity to the design and fabrication of the chip, require costly space, and can slow performance.

The devices in a modern integrated circuit can be spread over areas of over 4 cm$^2$. Given that the devices can number over 50M, it is impossible to examine each one individually, and in many cases, there is a tremendous premium on being able to look at the full chip in a single measurement. In such situations, the inability to spatially resolve each individual gate is irrelevant if there are unique signatures for the activity by groups of gates. Of special interest is to efficiently identify regions of anomalous activity as a function either of the machine state or other operational indices.

Activity at a gate depends on the temporal behavior of the inputs. The unsynchronized arrival of the inputs to a gate can create a situation where the gate switches only once as the inputs all settle to their final value, or where the gate can show multiple switching events if the individual inputs achieve their final values at different times. This has been described as mid-cycle false switching. In the end, the output of the gate is the correct value, but between when the first input arrives and when the last input arrives, the gate can undergo a series of switching events which will consume excessive current and power. The detection and quantification of mid-cycle false switching can be important in helping chips achieve their design targets with regards to current and power consumption.

The operating environment of modern ICs can change either deliberately or accidentally. Modern ICs used for mobile applications can operate at several different voltages, corresponding to several different clock frequencies. Sweeping across these frequencies can produce anomalous coincidences in circuit activity whose identification can be difficult using manual, point by point measurement techniques. Depending on application, the operating temperature of a chip can vary from temperature below 0 C. to temperatures in excess of 100 C. The ability to guarantee that no anomalous collective behavior involving either local heating or local loading of the power supply over a range of operating temperatures is important in circuit verification.

SUMMARY OF THE INVENTION

An object of this invention is to improve methods and systems for inspecting or testing CMOS circuits.

Another object of the present invention is to measure the density of local switching activity in CMOS integrated circuits.

These and other objectives are attained with a method and system for testing an integrated circuit. The method comprises the steps of obtaining periodic optical emissions over a defined period of time and from a defined area of an integrated circuit operating with time-varying internal currents, and time resolving said emissions by photon timing, also known as time correlated photon counting, to estimate the number of switching events occurring in said defined area over said defined period. The method further comprises the steps of providing an optical emission model, and comparing the optical emissions from the area of the integrated circuit with the optical emission model to determine whether any of a group of defined conditions are present on the integrated circuit. For example, this test may be used to detect local power supply loading under high power density operation, or to derive changes in performance due to heating effects.

The above-mentioned optical emission model can be both a mathematically derived model, and also a model derived from experiments on the chip being measured when the input conditions are varied so that isolated gate activity can be identified.

With the present invention, the optical waveform of the emitted light is used to determine the temporal variation of the electrical voltages in the devices and circuits. Here, the term optical waveform refers to the time dependence of the optical emission from an individual device which is undergoing periodic variation in its electrical waveform, such as logic state switching. In the common case of MOS circuits, light is emitted mainly when an individual device is in saturation. Light emission from a non-time-varying yet normally operating CMOS logic circuit, which draws very little average current, is essentially undetectable with present detectors. However, individual CMOS devices draw significant current and may very briefly be in saturation when the CMOS gate switches logic states, and the optical emission from a normally operating CMOS circuit when undergoing switching is detectable.

Consistent with the above discussion, the emission is found to be a subnano-second pulse coincident with switching. This pulsed emission can be a useful contactless probe of a circuit for switching speeds up to and exceeding 10 GHz. In addition, the emitted photon energy can be either above or below the energy gap of the semiconductor. Thus, the measurement may be performed from either the front side or the backside of the wafer. For detection from the front side of the wafer, any photons emitted by the elements of the integrated circuit can be detected. For detection from the backside of the wafer, only photons which are at a wavelength transparent to the substrate can be detected. Ideally, for backside detection, as presently realized, the backside of the wafer should be optically polished and the wafer should be as thin as practical while not altering the electrical characteristics of the circuit.

The present invention enables measurements from fully-functional integrated circuits. Specifically, this invention obtains dynamic information on a fully-functional normal integrated circuit, and requires no special devices or structures to be manufactured on the integrated circuit solely for the purpose of the testing. Moreover, this invention is capable of testing from either the front side or the back side of the integrated circuit, requires no external probe such as a laser or an electron beam, and can be implemented either in a single channel version or in a multichannel version capable of monitoring numerous areas on the same chip simultaneously.

Further, this invention utilizes the same clock as the usual chip clock, with no constraints on clock frequency; is capable of measuring switching speeds in excess of 10 GHz; is non-destructive of the circuit under test; and can perform tests in air and does not require vacuum or unique environment.

Apparatus embodying the invention comprises a combination of an optical microscope and a detector, where the detector is capable of providing optical waveforms and/or a spatial image of the light emitted by the individual devices which comprise an integrated circuit. The microscope and detector are used together such that an image of a defined area of an integrated circuit under test is provided by the microscope to the detector. The spatial and temporal information from the optical detector is used to determine switching densities and other dynamic information about that defined area. This can be done by comparing the optical emission from the area of the integrated circuit with the optical emission model to determine whether any of a group of defined conditions are present in the integrated circuit Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
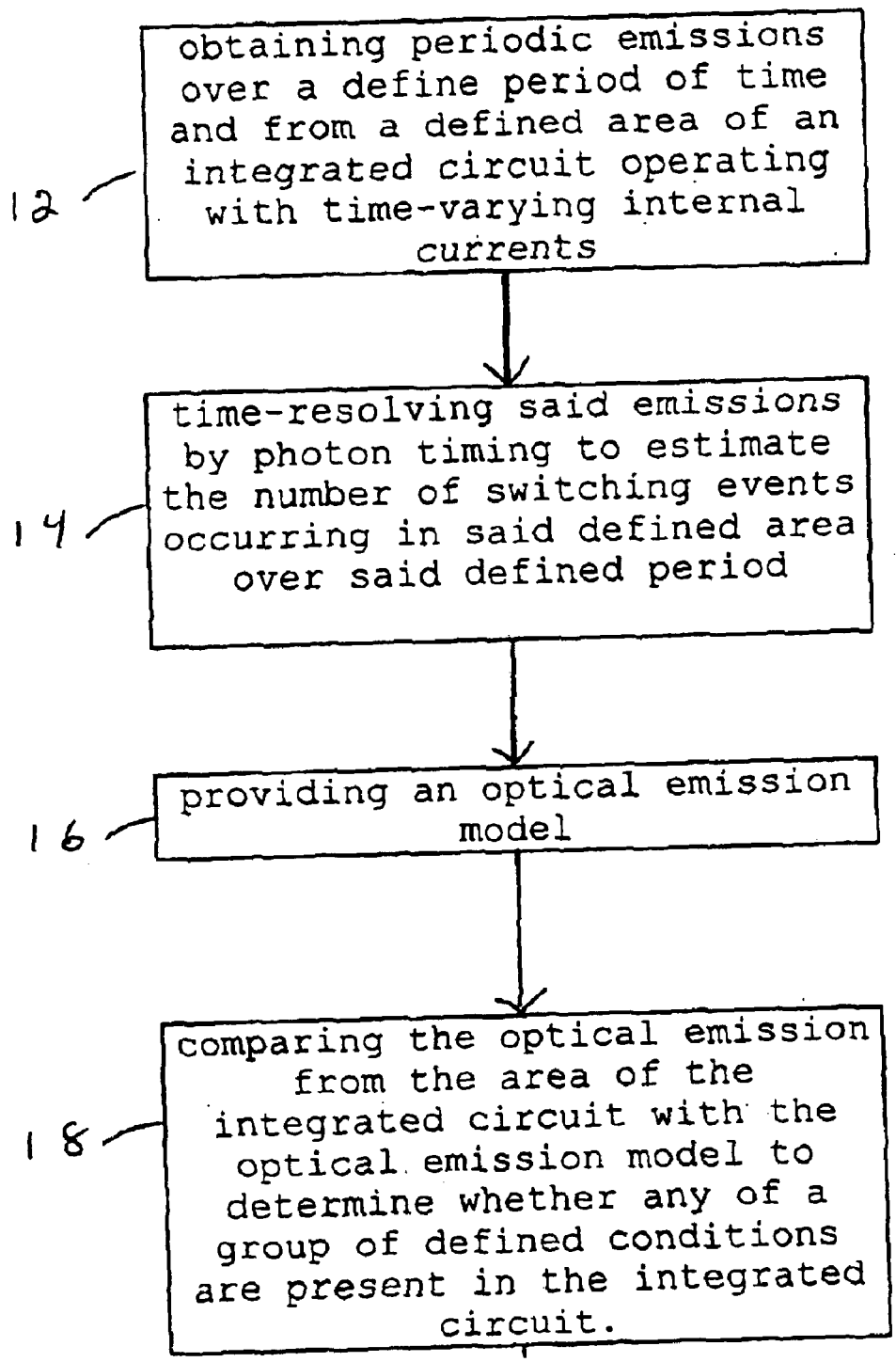
FIG. 1 generally outlines a method embodying this invention.

With reference to FIG. 1, the present invention, generally relates to a method and system for testing an integrated circuit. The method comprises the steps 12, 14 of obtaining periodic optical emissions over a defined period of time and from a defined area of an integrated circuit operating with time-varying internal currents, and time resolving said emissions by photon timing to estimate the number of switching events occurring in said defined area over said defined period. The method further comprises the steps 16, 18 of providing an optical emission model, and comparing the optical emissions from the area of the integrated circuit with the optical emission model to determine whether any of a group of defined conditions are present on the integrated circuit. For example, this test may be used to detect local power supply loading under high power density operation, or to derive changes in mobility due to heating effects.

Picosecond Imaging Circuit Analysis (PICA) is used for identifying when many gates in a small area are active during some small period of time. Its imaging character means it can look at large areas of a chip, and observe where switching occurs as a function of time in a test loop. It can then be used to non-invasively measure local properties of working CMOS devices in the presence of neighboring active gates and high speed operation. This is based on measurements of the optical waveforms of selected gates in the IC under test. Typically, because they produce the most light per switching events, simple inverters, and chains of inverters, which are found normally throughout all ICs, are ideal test points for such PICA measurements. The time variation of the intensities of the optical emission from these selected gates or test points operating in isolation can be measured using appropriate test vectors as a function of critical parameters such as the bias voltage, substrate temperature, and clock frequency.

Changes in the measured optical waveforms between the high and low power density applications and/or frequency and/or other means can be used to detect local power supply loading under high power density operation or to derive changes in mobility due to heating effects. Loading of the local power lines by the excessive concentration of electrical activity in a small area of the circuit will produce both a slowing of the switching times, and gate to gate delays, and also a decrease in the intensity of the emission. Similar quantitatively distinguishable changes are also associated with local heating, due to a reduction in the mobility of carriers in the channel. Calibration of the light emission associated with the normal operation of gates on chip can be used with time resolved images of the light emission from a chip during the execution of given sets of instructions to determine the density of switching events in particular areas of the chip.

This invention is non-invasive and completely compatible with the flip chip packaging practices which are now widely used for high end IC's. The effective use of PICA for this problem draws on all of its properties and requires several different types of normalization, all of which are easily implemented with existing PICA systems. The time resolved imaging aspect of PICA makes it the ideal tool for detecting when there are high densities of switching activity in small areas of chip over short periods of time. By binning the times of emissions on the scale of the time constant for the power distribution system, and given a knowledge of the intensity of the light emission from the different logic gates in the circuit, PICA can be used to estimate the number of switching events occurring in any area of the chip over any interval of time, for any set of instructions operating in the chip. When regions in space and time of high switching activity are identified, PICA can be used to diagnose whether the activity is perturbing the operation of the gates in the area. This can be done by the procedures described above.

CMOS gates normally only emit light during switching. Properly functioning CMOS gates which are not switching do not load a power supply, do not dissipate power, and do not emit light. Gates which are switching, consume power during switching, emit light, and are candidates for study by PICA.

If an error is detected during electrical testing which is suspected of arising from a high density of switching activity in an IC during some part of the execution of the test vector, or if the time dependence of the local power consumption in the chip is required for other reasons, a time resolved PICA image of the chip can be obtained. One requirement on this measurement is that its time resolution be better than the time constant of the power distribution system, and the thermal time constant of the chip.

A second requirement is that the integration time be long enough to either observe emission from all active gates, or from enough gates that the activity in neighboring gates can be inferred, along with their power dissipation. The second requirement reflects the fact that different kinds of gates emit different amounts of light during switching. Therefore, observing light emission due to switching activity from every gate can require long measurement times, which may not be necessary given a knowledge of the circuit operation and layout, and the test program.

From such a time resolved PICA image, the time dependent density of switching activity in local regions of an IC can be derived. Knowledge of the character of the gates producing the PICA emission, and the loads that they are driving along with the PICA images can be used to produce maps of the time resolved local power dissipation. The high density regions of power dissipation can then be examined using PICA to determine whether they modify the operation of the gates through mechanisms such as the modulation of the local supply voltage, localized heating, etc.

PICA can study the behavior of individual gates due to its ability to obtain the time dependence of the intensities of the light emission from a single waveform. In addition, spectral information on the light emission can also be obtained. The optical waveform of the emission from an individual gate depends on the properties of the gate including its bias voltage, the carrier mobility, the geometry of the gate, etc. The dependence of the light emission of a simple gate such as an inverter on operating frequency and supply voltage can be easily measured on the test devices and circuits that are produced in conjunction with the creation of integrated circuits. Through the suitable choice of test vectors, it is often possible to operate the gates of interest which are found in a high dissipation environment where many neighboring gates are active at the same time, either in a low dissipation mode where relatively few neighboring gates are switching, or in the high dissipation environment where many neighboring gates are switching at the same time as the probe point.

Figure 2:
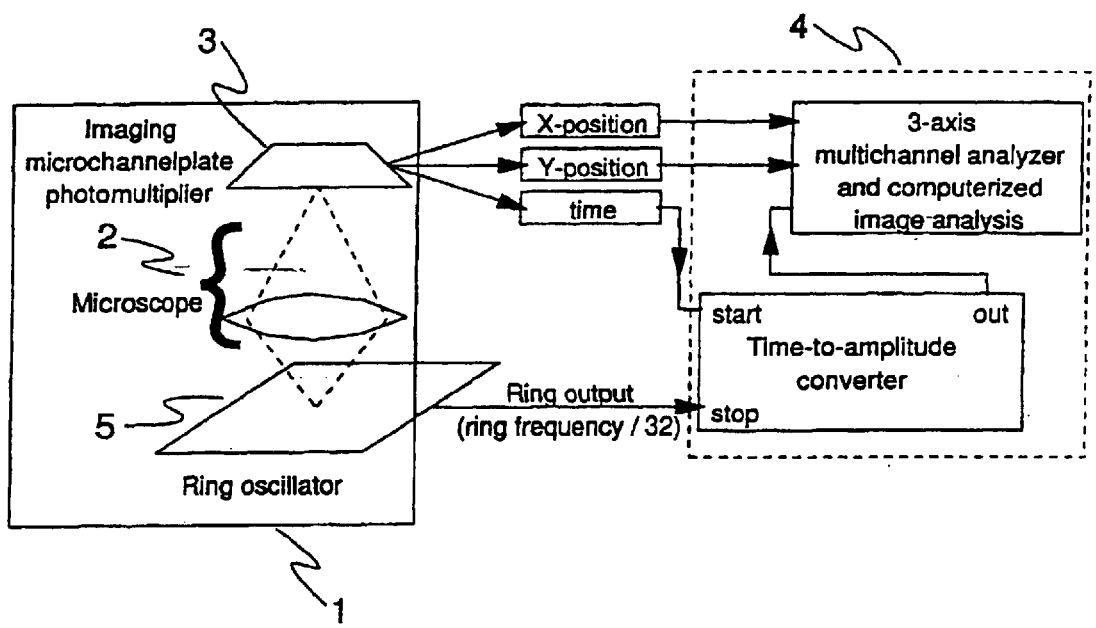
FIG. 2 shows schematically an apparatus embodying this invention.

The ability to identify a low dissipation environment for well characterized gates allows verification that the well characterized gates behave similarly to the test structures. If no differences are seen in the emission from the test structures, and the sample gates in low and high dissipation environments, then the high dissipation environment is neither loading the local power supply, nor heating the neighborhood of the test point. Dissipation level dependent changes in the intensity of the test point emission, the rise and fall times of the test gates, and the spectra of the hot carrier emission can be quantitatively related to decreases in the mobility of the CMOS channels due to local heating, or to loading of the local power supply. For example, it has been shown that decreasing the bias voltage across a gate produces an exponential decrease in the intensity of its emission, increases its switching time quadratically, and increases the rate of change with energy of the spectral dependence of the emission. Detection of such changes would be a signature of decreased bias voltages FIG. 2 shows schematically an apparatus for obtaining time resolved optical images and optical waveforms according to the invention. The apparatus of FIG. 2 comprises a dark space 1, a microscope 2 having at least its objective disposed in the dark space 1, an imaging optical detector 3 such as an imaging microchannelplate photo multiplier tube, a readout 4 for the imaging detector 3 capable of providing a series of optical images of the emission, each comprising a separate time interval. Alternatively, readout 4 is capable of providing a series of optical waveforms detected by detector 3, where each waveform is obtained from a different portion of the image. A semiconductor integrated circuit to be evaluated 5 is mounted in the dark space at the focus of the microscope objective and powered by a suitable power source. Ideally, detector 3 is capable of counting single photons. For a photon-counting detector, the portion of readout 7 which provides temporal information can be of the type described in the literature as photon timing. Other optical sampling techniques such as up-conversion or a streak camera may also be used.

In a specific implementation of the apparatus of FIG. 2, the imaging optical detector 3 was an imaging microchannelplate photomultiplier tube (MEPSICHRON) available from Quantar Technology Inc. of Santa Cruz, Calif. This type of photomultiplier has been shown to be capable of about 100 psec time resolution. This is far shorter than the time constants of the power supply and the thermal time constant of the chip. The required time constants for these measurements are those of the power supplies and the chips. The readout 4 was a three dimensional multichannel analyzer, which stored information about both the position (x,y) and time (t) for each photon detected. The photons detected over a time interval may be displayed as an image. Each such image shows which devices of circuit 5 are in the process of changing logic states during that time interval.

This is because changes in logic states during CMOS circuits involve changing the voltage at the output of a gate from ground to the bias voltage or from the bias voltage to ground. Although negligible currents (generating no observable light emission) flow in these circuits when the input and output voltages are held constant, measurable currents flow through the n- and p-MOSFET's of the CMOS circuits during switching, with the peak current at the time of most rapid voltage change. Because there are non-zero voltages across the n- and p-MOSFET's during this current pulse, light is emitted by the energetic electrons in the channels. At any given instant of time, only those CMOS gates that are switching states are passing current, and are emitting light.

For a photon-counting detector, readout 7 can be of the type described in the literature as photon timing, also known as time correlated photon counting, as described by Charbonneau et al., Res. Sci. Instrum. 63, 5315 (1992) which in incorporated here by reference. Although other types of readouts may be used, the photon timing readout preserves single photon sensitivity and is capable of determining the optical waveform with a demonstrated resolution of 20 psec. Other optical sampling techniques such as up-conversion as described by Shah et al., Appl. Phys. Lett. 50, 1307 (1987), which is incorporated herein by reference, or a streak camera, such as model C1587, manufactured by Hamamatsu Photonics K.K., Japan may also be used.

While it is apparent that the invention herein disclosed is well calculated to fulfill the objects previously stated, it will be appreciated that numerous modifications and embodiments may be devised by those skilled in the art, and it is intended that the appended claims cover all such modifications and embodiments as fall within the true spirit and scope of the present invention.

What is claimed is:

1. A method of testing an integrated circuit, comprising:
    obtaining periodic optical emissions over a defined period of time and from a defined area of an integrated circuit operating with time-varying internal currents;
    time-resolving said emissions by photon timing to estimate the number of switching events occurring in said defined area over said defined period;
    providing an optical emission model representing one of a group of defined conditions; and
    comparing the optical emission from the area of the integrated circuit with the provided optical emission model to determine whether said one of the group of defined conditions is present in the integrated circuit.

2. A method according to claim 1, wherein the group of defined conditions include local power supply loading under high power density operation, and changes in switching performance due to heating effects, mid-cycle false switching, effectiveness of switching control circuitry, leakage control circuitry, and cross-talk.

3. A method according to claim 1, wherein:
    the obtaining step includes the step of applying a given set of instruction vectors to the integrated circuit to provide calibrated optical emissions; and
    the time-resolving step includes the step of comparing said obtained optical emissions with said calibrated optical emissions.

4. A method according to claim 1, further comprising the step of using the integrated circuit with a power distributing system having a given time constant, and wherein the time resolving step includes the step of time resolving said emissions at a resolution greater than said time constant.

5. A method according to claim 1, wherein the integrated circuit has a thermal time constant, and the time resolving step includes the step of time resolving said emissions at a resolution greater than said thermal time constant.

6. A method according to claim 1, wherein the defined area includes groups of switches, each of said groups having a unique signature emission waveform, and the comparing step includes the step of searching the optical emissions from the area for any of the signature emission waveforms of said groups.

7. A method according to claim 6, wherein each of said groups of switches is comprised of a set of spatially unresolved individual gates.

8. A system for testing an integrated circuit, comprising:
means for obtaining periodic optical emissions over a defined period of time and from a defined area of an integrated circuit operating with time-varying internal currents;
means for time-resolving said emissions by photon timing to estimate the number of switching events occurring in said defined area over said defined period;
means for providing an optical emission model representing one of a group of defined conditions; and
means for comparing the optical emission from the area of the integrated circuit with the provided optical emission model to determine whether said one of the group of defined conditions is represent in the integrated circuit.

9. A system according to claim 8, wherein the group of defined conditions include local power supply loading under high power density operation, and changes in switching performance due to heating effects, mid-cycle false switching, effectiveness of switching control circuitry, leakage control a circuitry, and cross-talk.

10. A system according to claim 8, wherein:
the obtaining means includes means for applying a given set of instruction vectors to the integrated circuit to provide calibrated optical emissions; and
the time-resolving means includes means for comparing said obtained optical emissions with said calibrated optical emissions.

11. A system according to claim 8, wherein the integrated circuit is used with a power distributing system having a given time constant, and wherein the time resolving means includes means for time resolving said emissions at a resolution greater than said time constant.

12. A system according to claim 8, wherein the integrated circuit has a thermal time constant, and the time resolving means includes means for time resolving said emissions at a resolution greater than said thermal time constant.

13. A program storage device readable by machine, tangibly embodying a program of instructions executable by the machine to perform method steps for testing an integrated circuit, said method steps comprising:
obtaining periodic optical emissions over a defined period of time and from a defined area of an integrated circuit operating with time-varying internal currents;
time-resolving said emissions by photon timing to estimate the number of switching events occurring in said defined area over said defined period;
providing an optical emission model representing one of a group of defined conditions; and
comparing the optical emission from the area of the integrated circuit with the provided optical emission model to determine whether said one of the group of defined conditions is present in the integrated circuit.

14. A program storage device according to claim 13, wherein the group of defined conditions include local power supply loading under high power density operation, changes in switching performance mobility due to heating effects, mid-cycle false switching.

15. A program storage device according to claim 13, wherein:
the obtaining step includes the step of applying a given set of instruction vectors to the integrated circuit to provide calibrated optical emissions; and
the time-resolving step includes the step of comparing said obtained optical emissions with said calibrated optical emissions.

16. A program storage device according to claim 13, further comprising the step of using the integrated circuit with a power distributing system having a given time constant, and wherein the time resolving step includes the step of time resolving said emissions at a resolution greater than said time constant.

17. A program storage device according to claim 13, wherein the integrated circuit has a thermal time constant, and the time resolving step includes the step of time resolving said emissions at a resolution greater than said thermal time constant.

18. A method according to claim 1, wherein said one of the group of defined conditions is selected from the group consisting of: local power supply loading under high power density operation, changes in switching performance due to heating effects, mid-cycle false switching, effectiveness of switching control circuitry, leakage control circuitry, and cross-talk.

19. A system according to claim 8, wherein said one of the group of defined conditions is selected from the group consisting of: local power supply loading under high power density operation, changes in switching performance due to heating effects, mid-cycle false switching, effectiveness of switching control circuitry, leakage control circuitry, and cross-talk.

20. A program storage device according to claim 13, wherein said one of the group of defined conditions is selected from the group consisting of: local power supply loading under high power density operation, changes in switching performance due to heating effects, mid-cycle false switching, effectiveness of switching control circuitry, leakage control circuitry, and cross-talk.

* * * * *

UNITED STATES PATENT AND TRADEMARK OFFICE
CERTIFICATE OF CORRECTION

PATENT NO. : 6,774,647 B2
DATED : August 10, 2004
INVENTOR(S) : Jeffrey A. Kash et al.

It is certified that error appears in the above-identified patent and that said Letters Patent is hereby corrected as shown below:

Column 9,
Lline 24, "represent" should be -- present --
Line 29, delete "a"

Signed and Sealed this

Twenty-eighth Day of June, 2005

JON W. DUDAS
*Director of the United States Patent and Trademark Office*